(12) United States Patent
Miller et al.

(10) Patent No.: US 12,188,763 B2
(45) Date of Patent: Jan. 7, 2025

(54) DOT PROJECTOR INCLUDING HYBRID REFRACTIVE-DIFFRACTIVE OPTICAL ELEMENTS

(71) Applicant: Lumentum Operations LLC, San Jose, CA (US)

(72) Inventors: John Michael Miller, Ottawa (CA); Vincent V. Wong, Los Altos, CA (US); Lei Yang, Albuquerque, NM (US)

(73) Assignee: Lumentum Operations LLC, San Jose, CA (US)

( * ) Notice: Subject to any disclaimer, the term of this patent is extended or adjusted under 35 U.S.C. 154(b) by 328 days.

(21) Appl. No.: 17/644,974

(22) Filed: Dec. 17, 2021

(65) Prior Publication Data

US 2023/0072500 A1  Mar. 9, 2023

Related U.S. Application Data

(60) Provisional application No. 63/260,993, filed on Sep. 8, 2021.

(51) Int. Cl.
| | | |
|---|---|---|
| *G01B 11/25* | (2006.01) | |
| *G02B 27/30* | (2006.01) | |
| *H01S 5/42* | (2006.01) | |

(52) U.S. Cl.
CPC .......... *G01B 11/2513* (2013.01); *G02B 27/30* (2013.01); *H01S 5/423* (2013.01)

(58) Field of Classification Search
CPC ............ G01B 11/2513; G02B 19/0014; G02B 19/0057; G02B 27/106; G02B 27/30; G02B 3/08; H01S 5/0071; H01S 5/423

USPC ......................................................... 356/614
See application file for complete search history.

(56) References Cited

U.S. PATENT DOCUMENTS

| | | | | |
|---|---|---|---|---|
| 9,188,874 | B1* | 11/2015 | Johnson | G02B 21/002 |
| 2021/0044748 | A1* | 2/2021 | Hu | G02B 1/002 |
| 2022/0337727 | A1* | 10/2022 | Ye | G02B 13/06 |
| 2022/0385042 | A1* | 12/2022 | Devlin | G02B 19/0057 |

OTHER PUBLICATIONS

Jose Sasian, "Mobile Phone Lenses: Lens Design OPTI 696A," The University of Arizona, College of Optical Sciences, Nov. 2018, 33 pages.
"Himax 2 in 1 Optical Performance Report," Himax Technologies, Incl, Oct. 5, 2020, 6 pages.

* cited by examiner

*Primary Examiner* — Sunghee Y Gray
(74) *Attorney, Agent, or Firm* — Harrity & Harrity, LLP (57) ABSTRACT

A dot projector may include a vertical-cavity surface-emitting laser (VCSEL). The dot projector may include one or more collimating elements to collimate light emitted by the VCSEL. An effective focal length of the one or more collimating elements may be larger than an optics length of the dot projector. The dot projector may include an optical element including a periodic optical phase function to replicate the light after collimation by the one or more collimating elements and an aberration-correcting phase function to correct spot aberrations in a dot pattern resulting from the tiling or splitting of the light.

20 Claims, 6 Drawing Sheets

DOT PROJECTOR INCLUDING HYBRID REFRACTIVE-DIFFRACTIVE OPTICAL ELEMENTS

CROSS-REFERENCE TO RELATED APPLICATION

This Patent Application claims priority to U.S. Provisional Patent Application No. 63/260,993, filed on Sep. 8, 2021, and entitled "DOT PROJECTOR INCLUDING A HYBRID REFRACTIVE-DIFFRACTIVE OPTICAL ELEMENT." The disclosure of the prior Application is considered part of and is incorporated by reference into this Patent Application.

TECHNICAL FIELD

The present disclosure relates generally to a dot projector and, more particularly, to a dot projector including one or more hybrid refractive-diffractive optical elements.

BACKGROUND

A dot projector (also referred to as a pattern projector) can be used in a variety of three-dimensional (3D) sensing applications, such as a facial recognition application. Typically, a dot projector includes an array of emitters, one or more lenses, and one or more beam splitting gratings. The one or more lenses operate in conjunction with the one or more beam splitting gratings to a project and create a number of duplications of a dot pattern from light emitted by emitters in the array.

SUMMARY

Some implementations described herein relate to a dot projector. The dot projector may include a vertical-cavity surface-emitting laser (VCSEL) chip; one or more collimating elements to collimate light emitted by the VCSEL chip, wherein an effective focal length of the one or more collimating elements is larger than an optics length of the dot projector; and an optical element including a periodic optical phase function to replicate the light after collimation by the one or more collimating elements, and an aberration-correcting phase function to correct spot aberrations in a dot pattern resulting from the tiling or splitting of the light.

Some implementations described herein relate to a device. The device may include one or more collimating elements having an effective focal length that is larger than an optics length of the device and an optical element including a periodic optical phase function to replicate light received from the one or more collimating elements, and an aberration-correcting phase function to correct spot aberrations in a dot pattern resulting from the tiling or splitting of the light by the periodic optical phase function.

Some implementations described herein relate to a system. The system may include an emitter array; at least one collimating element to collimate light emitted by the emitter array; and an optical element including a first surface comprising a periodic optical phase function to replicate the light after collimation by the at least one collimating element, and a second surface comprising an aberration-correcting phase function to correct spot aberrations in a dot pattern resulting from the tiling or splitting of the light by the periodic optical phase function.

DETAILED DESCRIPTION

The following detailed description of example implementations refers to the accompanying drawings. The same reference numbers in different drawings may identify the same or similar elements.

A total module height constraint (also referred to as a z-height constraint) often exists for a dot projector due to, for example, a limited amount of physical space being available for the dot projector. Notably, a conventional optical design with a total module height constraint and a single refractive collimating lens suffers from spot aberrations for off-axis or diagonal dots in a given tile, which leads to blurred or overlapping dots at a projection surface. In some cases, additional refractive surfaces could be added to the collimating lens to correct these aberrations. However, including additional refractive surfaces could increase the z-height of the dot projector, the number of components needed in the dot projector, the cost of the dot projector, and/or the complexity associated with manufacturing the dot projector.

In one example, a vertical-cavity surface-emitting laser (VCSEL) chip can be used to create approximately 30,000 dots within a field of view (FOV) of 52×77 degrees. Here, a z-height constraint may require the total z-height to be less than or equal to approximately 5.0 millimeters (mm), which in this example includes approximately 0.3 mm for a VCSEL substrate and mounting. Therefore, in this example, an optics length (referred to as a total track length (TTL))—measured from an emitting surface of the VCSEL chip to an outer surface of a diffractive optical element (DOE) substrate of the dot projector—should be less than or equal to approximately 4.7 mm. Here, since a VCSEL active area aspect ratio is fixed, a 7×11 tiling DOE with a focal length of approximately 5.0 mm and a magnification of approximately −80 would generate the approximately 30,000 dots in the required FOV with tile-to-tile gaps of less than approximately 0.1 degree (°) (e.g., small tile gaps can be achieved by matching the VCSEL aspect ratio to a single tile angular aspect ratio, i.e., 612 microns (μm)/568 μm=1.08, which is approximately equal to (52°/7)/(77°/11)=1.06°. However, the effective focal length of the collimating lens is approximately 5.0 mm, which is 0.3 mm larger than the TTL of the dot projector. In one example optical design, a material from which the collimating lens is formed is a moldable glass with a refractive index of approximately 1.8 at 940 nanometers (nm). With such a material, a solution may exist to provide a z-height of less than or equal to approximately 4.7 mm. However, horizontal (H), vertical (V) and diagonal (D) emitters are not diffraction limited (i.e., ray intercepts fall outside of the Airy disk), especially for the D emitters. This leads to blurring of dots at a projection surface, and hence to a reduction in a dot contrast ratio (CR) when the spot size becomes larger than the diffraction limit.

These aberration and z-height problems are further compounded for some collimating lens plastics where the refractive index of a resin/plastic is lower, such as approximately 1.5. In such a design, a spot size may be much larger (e.g., up to approximately 1.9 times larger) than the spot size in the example described above, and the z-height may be approximately 5.1 mm. Notably, diffraction limited performance can be obtained with such an optical system and a collimating lens with a refractive index of 1.5 if the z-height constraint is removed. In such a case, the z-height would be approximately 5.7 mm (i.e., significantly larger than the z-height requirement).

Some implementations described herein provide a dot projector including one or more hybrid refractive-diffractive optical elements that provide aberration correction to enable a TTL of the dot projector to be less than an effective focal length of one or more collimating elements of the dot projector 100. In some implementations, the dot projector includes one or more collimating elements (e.g., one or more refractive collimating lenses, one or more diffractive collimating lenses, or the like) and an optical element. The optical element includes a periodic optical phase function (e.g., a tiling or beamsplitting DOE) and an aberration-correcting phase function. In some implementations, a TTL of the dot projector (e.g., an optics length from an emitting surface of the emitter array to an outer surface of the optical element) is smaller than an effective focal length of the one or more collimating elements. Therefore, aberration correction is provided (e.g., to improve performance) while enabling a z-height constraint to be satisfied, and without significantly increasing the number of parts, the cost, or the complexity of the dot projector (e.g., as compared to a conventional dot projector). The dot projector described herein has the further advantage that additional optical power in the aberration-correcting phase can be used to achieve the TTL that is less than the effective focal length of the one or more collimating elements. Additional details are provided below.

Figure 1:
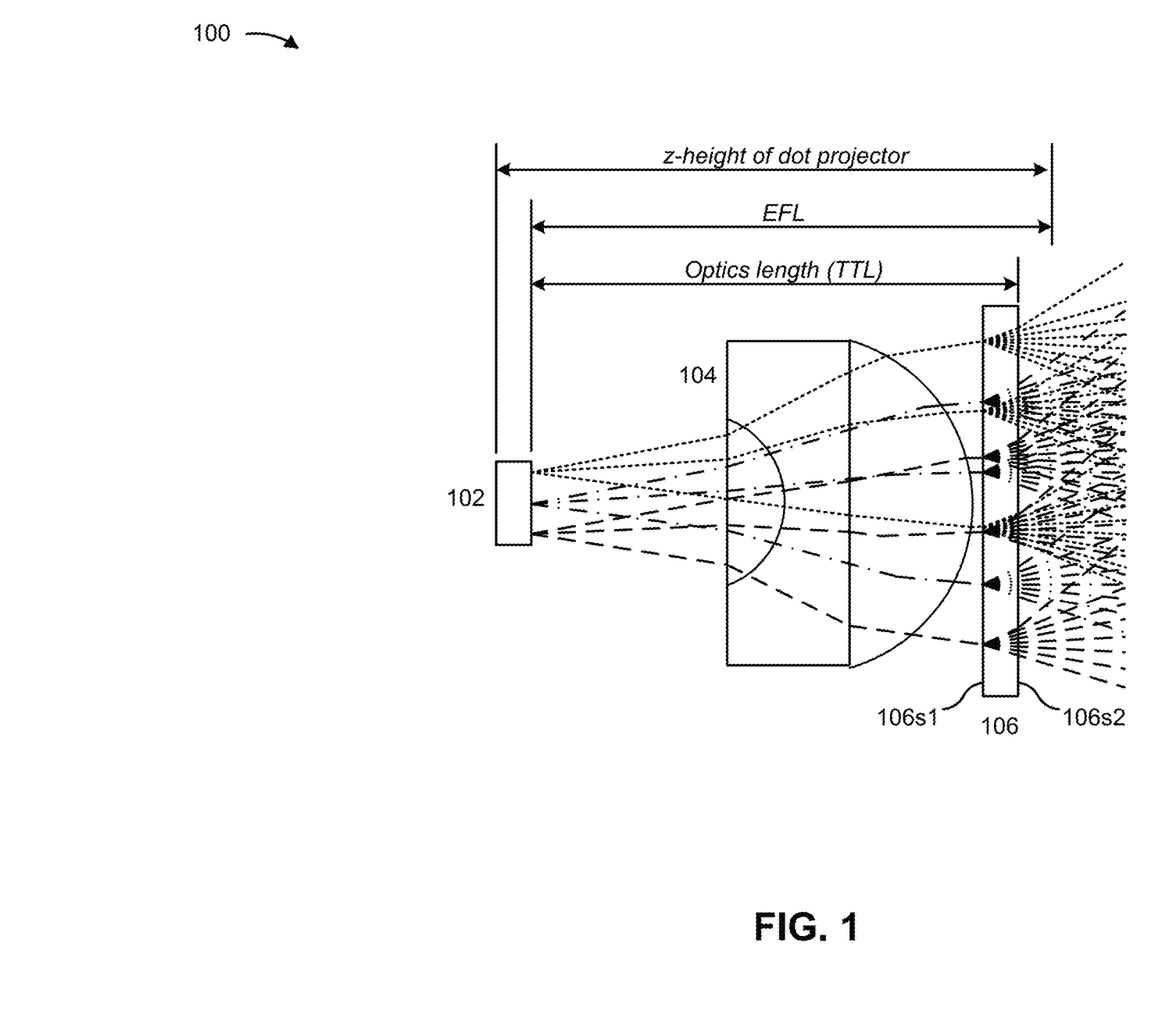
FIG. 1 is a diagram of an example dot projector including one or more hybrid refractive-diffractive optical elements, as described herein.

FIG. 1 is a diagram of an example dot projector 100 including one or more hybrid refractive-diffractive optical elements, as described herein. As shown in FIG. 1, the dot projector 100 may include an emitter array 102, one or more collimating elements 104, and an optical element 106 including a surface 106s1 and a surface 106s2.

The emitter array 102 is an emitter array to provide light (e.g., beams of light) from which a dot pattern is to be generated by the dot projector 100. For example, the emitter array 102 may include a VCSEL chip comprising a plurality of VCSELs. The emitter array 102 may include a plurality of emitters, each of which is to provide a respective beam of light (e.g., for illustrative purposes, beams of light from three emitters of the emitter array 102 are shown in FIG. 1). In some implementations, the emitter array 102 is a bottom-emitting VCSEL array comprising a plurality of bottom-emitting VCSELs (i.e., emitters of emitter array 102 may emit light through a substrate side of the emitter array 102). In some implementations, the emitter array 102 is a top-emitting VCSEL array comprising a plurality of top-emitting VCSELs (i.e., emitters of emitter array 102 may emit light through a non-substrate side of the emitter array 102). In some implementations, the emitter array 102 is a one-dimensional (1D) array of emitters. In some implementations, the emitter array 102 is a two-dimensional (2D) array of emitters.

The one or more collimating elements 104 include one or more elements to collimate the light emitted by the emitter array 102. Notably, the one or more collimating elements 104 are designed such that an effective focal length of the one or more collimating elements 104 is larger than a TTL of the dot projector 100 (e.g., an optics length from an emitting surface of the emitter array 102 to the surface 106s2 of the optical element 106). That is, the one or more collimating elements 104 are designed such that the TTL of the dot projector 100 is smaller than the effective focal length of the one or more collimating elements 104.

In some implementations, the one or more collimating elements 104 include a single collimating element. For example, the one or more collimating elements 104 may include a single refractive collimating lens (e.g., comprising a concave surface and a convex surface). As another example, the one or more collimating elements 104 may include a single diffractive collimating lens having one or more diffractive surfaces. As another example, the one or more collimating elements 104 may include a single Fresnel-like lens. In some implementations, the use of a single collimating element 104 may reduce cost and complexity of the dot projector 100. Alternatively, the one or more collimating elements 104 may in some implementations include multiple collimating elements. For example, the one or more collimating elements 104 may include two or more refractive collimating lenses, two or more diffractive collimating lenses (each having one or more diffractive surfaces), two or more Fresnel-like lenses, or some combination of at least two of these types of lenses. In some implementations, the use of multiple collimating elements 104 may improve manufacturability of the dot projector 100 (e.g., by reducing sag in the collimating elements 104).

The optical element 106 is an element that replicates (e.g., tiles, splits, or the like) light in association with generating the dot pattern and provides aberration correction in a dot pattern resulting from the tiling or splitting of the light. In some implementations, the aberration correction provided by the optical element 106 enables a TTL of the dot projector 100 (e.g., the total length of the optics of the dot projector 100) to be less than the effective focal length of the one or more collimating elements 104 without significantly impacting quality in the dot pattern generated by the dot projector 100.

In some implementations, the optical element 106 includes a periodic optical phase function and an aberration-correcting phase function. That is, the periodic optical phase function and the aberration-correcting phase function may be integrated on one or more surfaces 106s of the optical element 106. The periodic optical phase function is a function that replicates (e.g., tiles, splits, or the like) the light (after collimation by the one or more collimating elements 104). The aberration-correcting phase function is a function that corrects spot aberrations in a dot pattern resulting from the tiling or splitting by the periodic optical phase function.

In some implementations, the aberration-correcting phase function is defined by a rotationally-symmetric polynomial. That is, a profile of the aberration-correcting phase function may be described by a rotationally-symmetric polynomial. Alternatively, in some implementations, the aberration-correcting phase function is defined by a non-rotationally-symmetric polynomial. That is, a profile of the aberration-correcting phase function may be described by a non-rotationally-symmetric polynomial, such as an extended polynomial.

In some implementations, the periodic optical phase function is on a same surface of the optical element 106 as the aberration-correcting phase function. For example, both the periodic optical phase function and the aberration-correcting phase function may be formed on the surface 106s1 of the optical element 106. As another example, both the periodic optical phase function and the aberration-correcting phase function may be on the surface 106s2 of the optical element 106. Alternatively, in some implementations, the periodic optical phase function is on a first surface of the optical element 106 and the aberration-correcting phase function is on a second surface of the optical element 106, with the second surface being different from the first surface. For example, the periodic optical phase function may be on the surface 106s1 of the optical element 106 and the aberration-correcting phase function may be on the surface 106s2 of the optical element 106.

In some implementations, the optical element 106 may be aligned to at least one of the one or more collimating elements 104. In some implementations, wafer level optics and/or wafer stacking technologies can be employed to align the optical element 106 and the at least one collimating element 104 together as a single piece or part.

As indicated above, FIG. 1 is provided as an example. Other examples may differ from what is described with regard to FIG. 1. The number and arrangement of elements shown in FIG. 1 are provided as an example. In practice, there may be additional elements, fewer elements, different elements, or differently arranged elements than those shown in FIG. 1. Furthermore, two or more elements shown in FIG. 1 may be implemented within a single element, or a single element shown in FIG. 1 may be implemented as multiple, distributed elements.

Figure 2A:
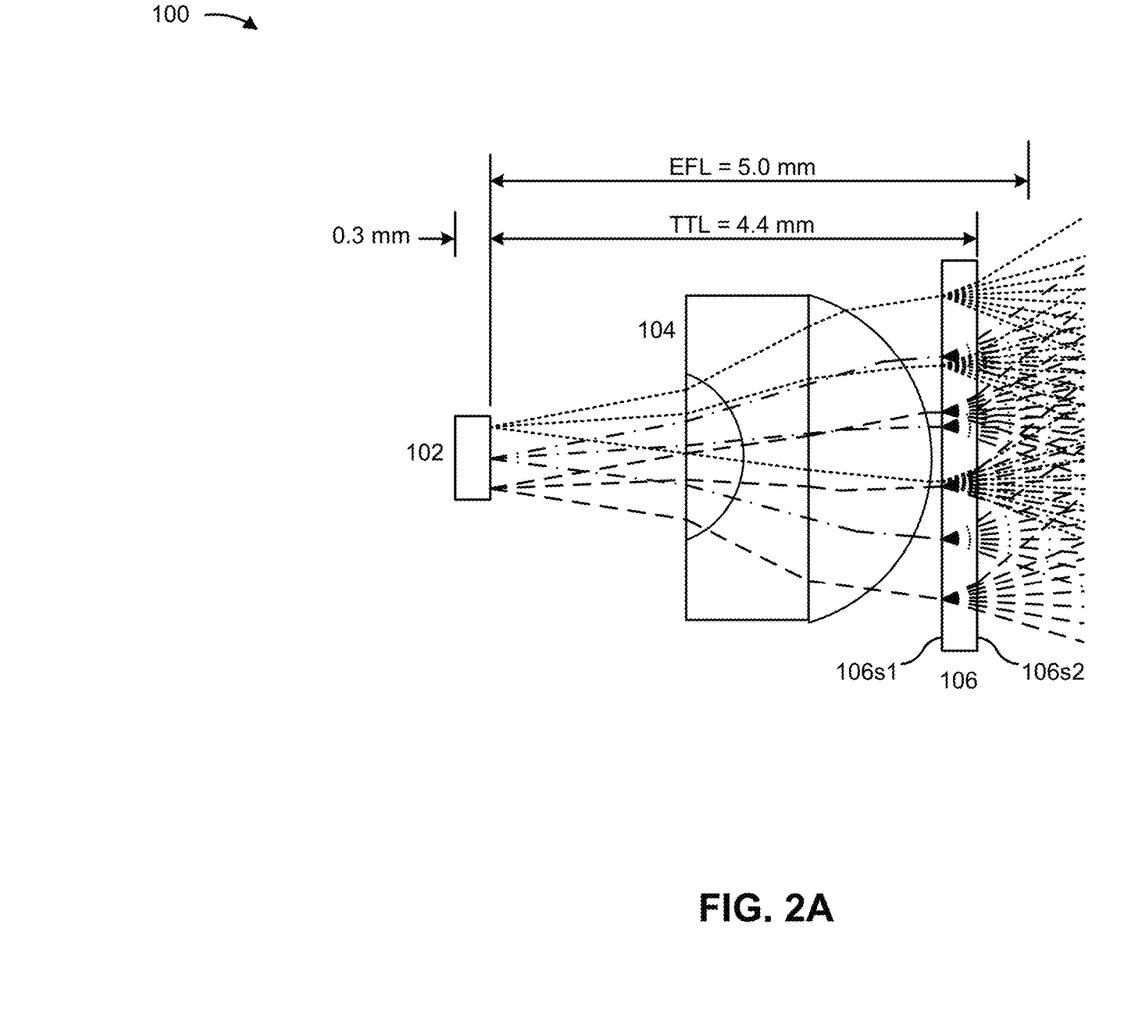
FIGS. 2A-2D are diagrams associated with a particular example implementation of the dot projector described herein.

FIGS. 2A-2D are diagrams associated with a particular example implementation of the dot projector 100 described herein. In the dot projector 100 associated with FIGS. 2A-2D, the total z-height constraint is 5.0 mm. As shown in FIG. 2A, the total z-height is approximately 4.7 mm (e.g., 0.3 mm from the emitter array 102+4.4 mm from the optics of the dot projector 100=4.7 mm), meaning that the total z-height constraint is satisfied. Further, in FIG. 2A, the TTL of the dot projector 100 is less than an effective focal length of the collimating element 104.

Figure 2B:
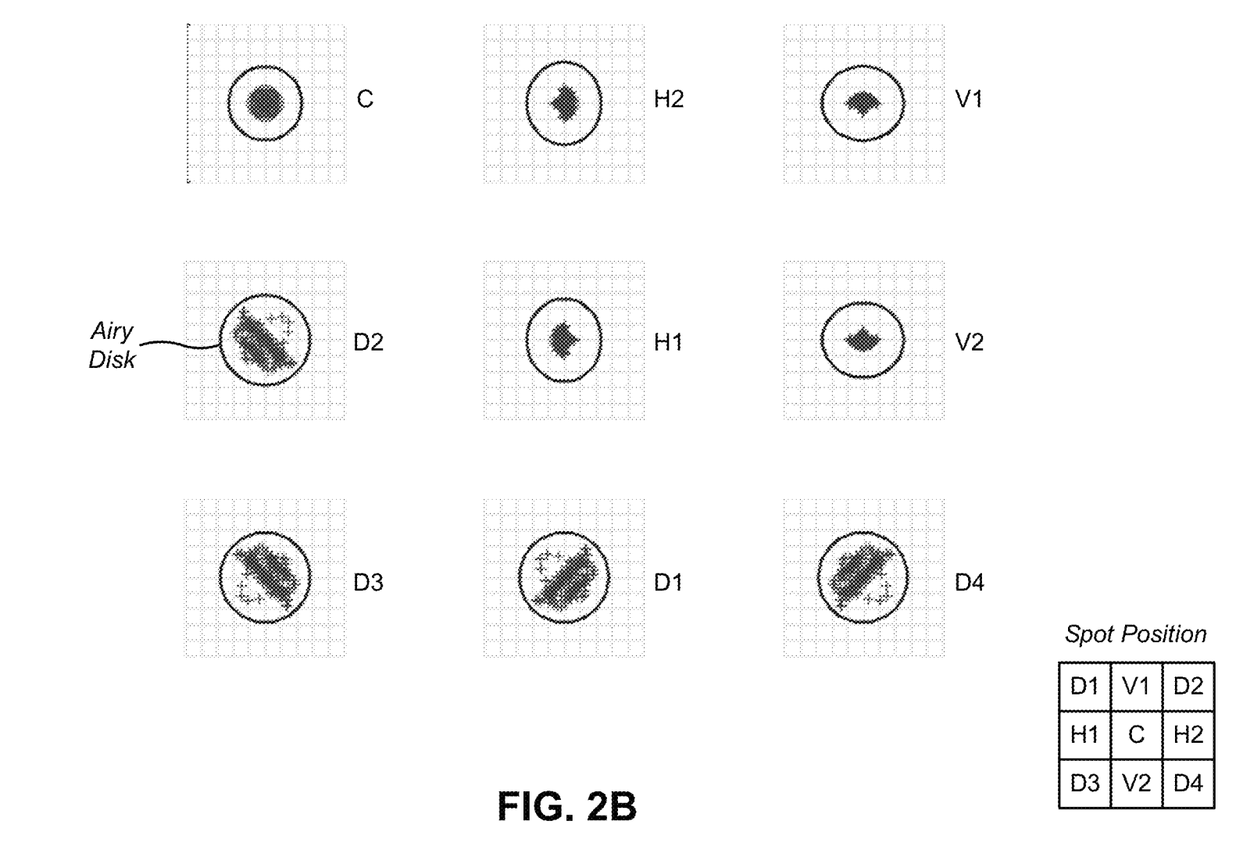

FIG. 2B includes H, V, and D spot diagrams provided by the dot projector 100 shown in FIG. 2A. As illustrated in FIG. 2B, not only are spot sizes diffraction limited (e.g., with ray intercepts falling within the Airy disks, which are indicated by the circles in each spot diagram), but the TTL of the dot projector 100 is approximately 4.4 mm, which is below the 4.7 mm required by the total z-height constraint.

Figure 2C:
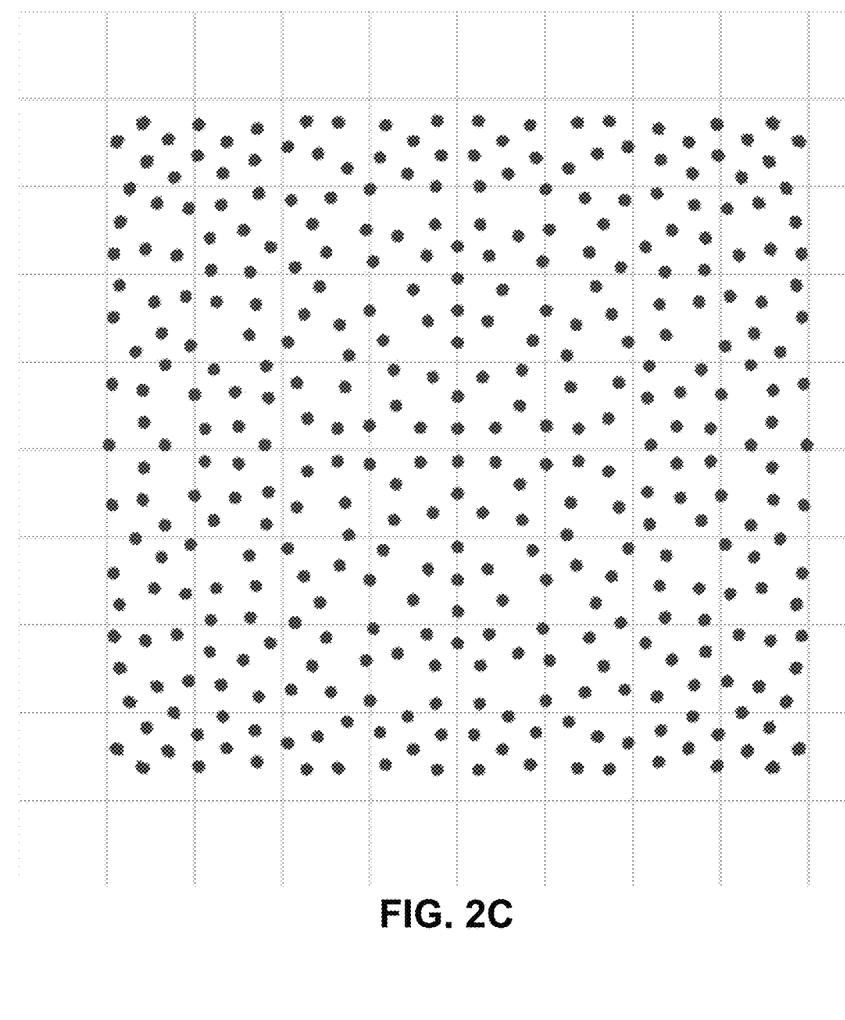

FIG. 2C includes a dot pattern of a central tile provided by the dot projector 100 shown in FIG. 2A. As illustrated in FIG. 2C, the aberration correction provided by the dot projector 100 prevents significant blurring in the dot pattern provided by the dot projector 100.

Figure 2D:
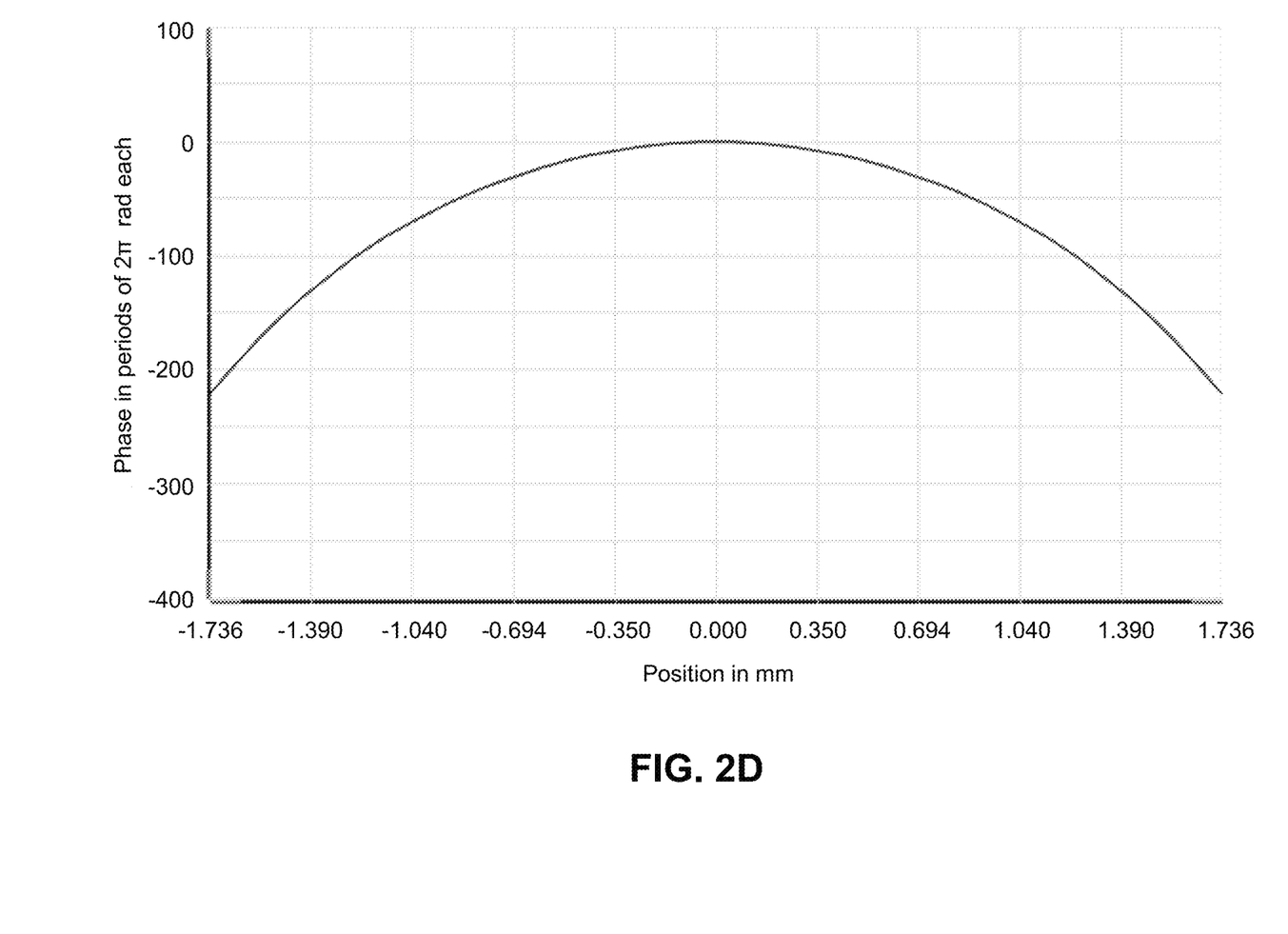

FIG. 2D includes an illustration of an aberration correction phase profile corresponding to the aberration-correcting phase function integrated in the optical element 106 included in the dot projector 100 shown in FIG. 2A. As illustrated in FIG. 2D, an average zone size of the aberration-correcting phase profile is approximately 7.9 microns (μm) (e.g., 1736 μm/220 (2π resets)), meaning that integration of the aberration-correcting phase function on the optical element 106 is a manufacturable (e.g., using existing deep ultraviolet (DUV) stepper, e-beam, and/or nano-imprint technologies).

As indicated above, FIGS. 2A-2D are provided as examples. Other examples may differ from what is described with regard to FIGS. 2A-2D. Further, the number and arrangement of elements shown in FIG. 2A are provided as an example. In practice, there may be additional elements, fewer elements, different elements, or differently arranged elements than those shown in FIG. 2A. Furthermore, two or more elements shown in FIG. 2A may be implemented within a single element, or a single element shown in FIG. 2A may be implemented as multiple, distributed elements.

In some implementations, a profile of a surface 106s of the optical element 106 is non-periodic. For example, a curvature provided by combining the periodic optical phase function and the aberration-correcting phase function on the same surface 106s may cause the profile of the surface 106s to be non-periodic. That is, in some implementations, a profile of the surface 106s of the optical element 106 is non-periodic due to a curvature of a combination of the periodic optical phase function and the aberration-correcting phase function.

Figure 3A:
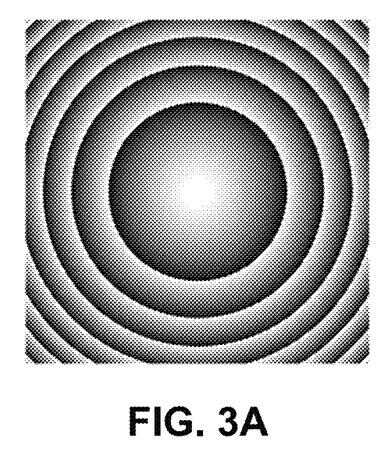
FIGS. 3A-3C are diagrams associated with an example implementation of a dot projector described herein in which a profile of a surface of an optical element of the dot projector is non-periodic.
Figure 3B:
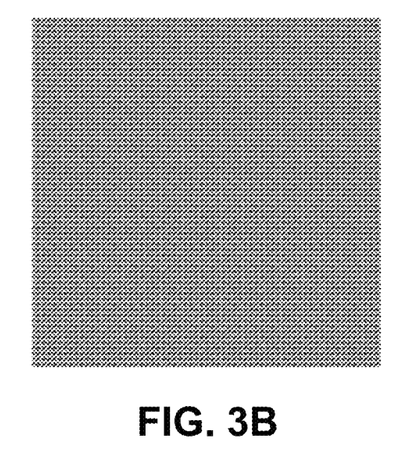
Figure 3C:
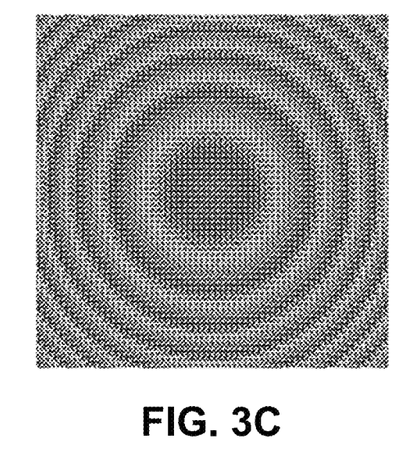

FIGS. 3A-3C are diagrams associated with an example implementation of the dot projector 100 in which a profile of a surface 106s of the optical element 106 is non-periodic.

FIG. 3A illustrates a top-view of a section of a surface profile of an example aberration-correcting phase function that can be implemented on a surface 106s of the optical element 106 (e.g., including 2π resets that define each "ring").

FIG. 3B illustrates a top-view of a section of a surface profile of an example periodic optical phase function that can be implemented on a surface 106s of the optical element 106. As illustrated by FIG. 3B, the periodic optical phase function alone may result in a periodic surface 106s of the optical element 106 (e.g., such that a repeated pattern is present on the surface 106s). In the example shown in FIG. 3B, approximately 50 periods are present in both the horizontal and vertical directions.

FIG. 3C illustrates a top-view of a section of a surface profile resulting from combining the example aberration-correcting phase function associated with FIG. 3A and the example periodic optical phase function associated with FIG. 3B on the surface 106s of the optical element 106. As illustrated in FIG. 3C, because of the curvature of the aberration-correcting phase function, the periodicity of the surface profile is warped (e.g., such that the profile of the surface 106s of the optical element 106 is non-periodic).

As indicated above, FIGS. 3A-3C are provided as examples. Other examples may differ from what is described with regard to FIGS. 3A-3C.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A dot projector, comprising: a vertical-cavity surface-emitting laser (VCSEL) chip;
   one or more collimating elements to collimate light emitted by the VCSEL chip,
     wherein an effective focal length of the one or more collimating elements is larger than an optics length of the dot projector, and
     wherein the optics length is measured from an emitting surface of the VCSEL chip to an outer surface of an optical element of the dot projector; and the optical element including:
   a first surface defined by a periodic optical phase function and configured to replicate the light after collimation by the one or more collimating elements, and
   a second surface defined by an aberration-correcting phase function and configured to correct spot aberrations in a dot pattern resulting from tiling or splitting of the light by the periodic optical phase function.

2. The dot projector of claim 1, wherein the first surface of the optical element is different from the second surface.

3. The dot projector of claim 1, wherein the one or more collimating elements include one or more refractive collimating lenses.

4. The dot projector of claim 1, wherein the one or more collimating elements include one or more diffractive collimating lenses, each having one or more diffractive surfaces.

5. The dot projector of claim 1, wherein the aberration-correcting phase function is defined by a rotationally-symmetric polynomial.

6. The dot projector of claim 1, wherein the aberration-correcting phase function is defined by a non-rotationally-symmetric polynomial.

7. The dot projector of claim 1, wherein a profile of a surface of the optical element is non-periodic due to a curvature of a combination of the periodic optical phase function and the aberration-correcting phase function.

8. A dot-projecting device, comprising:
   a light emitting surface of the dot-projecting device; and
   one or more collimating elements having an effective focal length that is larger than an optics length of the device,
     wherein the optics length is measured from the light emitting surface of the device to an outer surface of an optical element of the device; and
   the optical element including:
   a first surface defined by a periodic optical phase function and configured to replicate light received, after collimation, from the one or more collimating elements, and
   a second surface defined by an aberration-correcting phase function and configured to correct spot aberrations in a dot pattern resulting from tiling or splitting of the light by the periodic optical phase function.

9. The device of claim 8, wherein the periodic optical phase function is on a same surface of the optical element as the aberration-correcting phase function.

10. The device of claim 8, wherein the one or more collimating elements include one or more refractive collimating lenses.

11. The device of claim 8, wherein the one or more collimating elements include one or more diffractive collimating lenses, each having one or more diffractive surfaces.

12. The device of claim 8, wherein the aberration-correcting phase function is defined by a rotationally-symmetric polynomial.

13. The device of claim 8, wherein the aberration-correcting phase function is defined by a non-rotationally-symmetric polynomial.

14. The device of claim 8, wherein a curvature of a combination of the periodic optical phase function and the aberration-correcting phase function causes a profile of a surface of the optical element to be non-periodic.

15. A system, comprising:
   an emitter array;
   at least one collimating element to collimate light emitted by the emitter array,
     wherein an effective focal length of the at least one collimating element is larger than an optics length of the system, and
     wherein the optics length is measured from an emitting surface of the emitter array to an outer surface of an optical element of the system; and
   the optical element including:
   a first surface defined by a periodic optical phase function and configured to replicate the light after collimation by the at least one collimating element, and
   a second surface defined by an aberration-correcting phase function and configured to correct spot aberrations in a dot pattern resulting from tiling or splitting of the light by the periodic optical phase function.

16. The system of claim 15, wherein the first surface is different from the second surface.

17. The system of claim 15, wherein the at least one collimating element includes one or more refractive collimating lenses.

18. The system of claim 15, wherein the at least one collimating element includes a diffractive collimating lens that includes one or more diffractive surfaces.

19. The system of claim 15, wherein the aberration-correcting phase function is defined by a non-rotationally-symmetric polynomial.

20. The system of claim 15, wherein a profile of a surface of the optical element is non-periodic.

\* \* \* \* \*